United States Patent
Tu

(12) United States Patent (10) Patent No.: US 8,222,689 B2
Tu (45) Date of Patent: Jul. 17, 2012

(54) HIGH-VOLTAGE METAL OXIDE SEMICONDUCTOR DEVICE AND FABRICATION METHOD THEREOF

(75) Inventor: Kao-Way Tu, Jhonghe (TW)

(73) Assignee: Niko Semiconductor Co., Ltd., Taipei (TW)

( * ) Notice: Subject to any disclaimer, the term of this patent is extended or adjusted under 35 U.S.C. 154(b) by 84 days.

(21) Appl. No.: 12/285,179

(22) Filed: Sep. 30, 2008

(65) Prior Publication Data
US 2010/0078737 A1 Apr. 1, 2010

(51) Int. Cl.
*H01L 29/66* (2006.01)
(52) U.S. Cl. ............... 257/329; 257/E27.091; 438/137
(58) Field of Classification Search ................... 257/409
See application file for complete search history.

(56) References Cited

U.S. PATENT DOCUMENTS

| | | | |
|---|---|---|---|
| 5,998,833 A * | 12/1999 | Baliga | 257/329 |
| 2004/0207027 A1* | 10/2004 | Wu et al. | 257/393 |
| 2008/0197381 A1* | 8/2008 | Kawashima et al. | 257/255 |
| 2009/0309156 A1* | 12/2009 | Darwish et al. | 257/332 |
| 2010/0013552 A1* | 1/2010 | Darwish et al. | 327/581 |

* cited by examiner

*Primary Examiner* — Tony Tran
(74) *Attorney, Agent, or Firm* — Rosenberg, Klein & Lee

(57) ABSTRACT

A high-voltage metal oxide semiconductor device comprising a main body of a first conductivity type, a conductive structure, a first well of a second conductivity type, a source region of the first conductivity type, and a second well of the second conductivity type is provided. The conductive structure has a first portion and a second portion. The first portion is extended from an upper surface of the main body into the main body. The second portion is extended along the upper surface of the main body. The first well is located in the main body and below the second portion. The first well is kept away from the first portion with a predetermined distance. The source region is located in the first well. The second well is located in the main body and extends from a bottom of the first portion to a place close to a drain region.

6 Claims, 13 Drawing Sheets

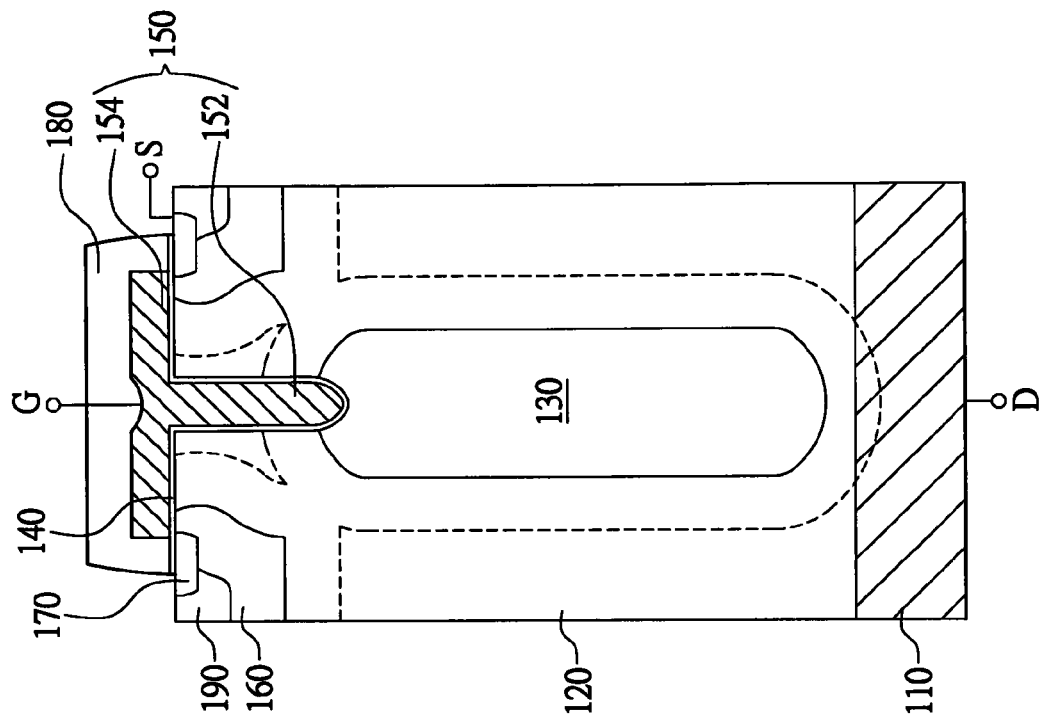
Fig. 2A
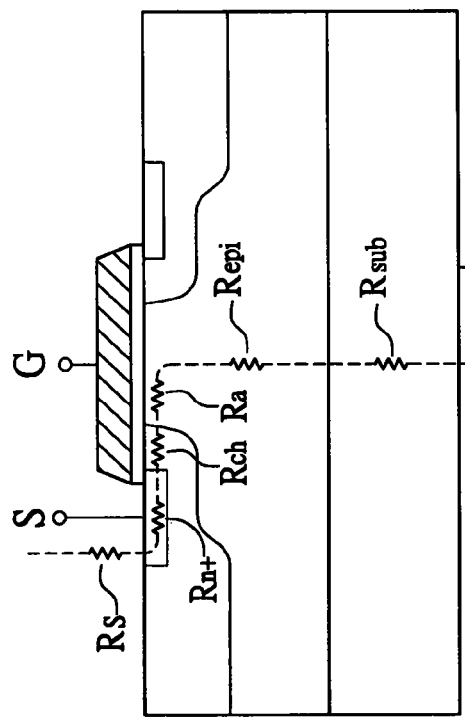
Fig. 1 (Prior Art)
| $R_{DS(ON)}$ | $V_{DG}$ = 30V | $V_{DG}$ = 600V |
|---|---|---|
| $R_s$ | 7% | 0.5% |
| $R_{n+}$ | 6% | 0.5% |
| $R_{ch}$ | 28% | 1.5% |
| $R_a$ | 23% | 0.5% |
| $R_{epi}$ | 29% | 96.5% |
| $R_{sub}$ | 7% | 0.5% |
Fig. 1A (Prior Art)

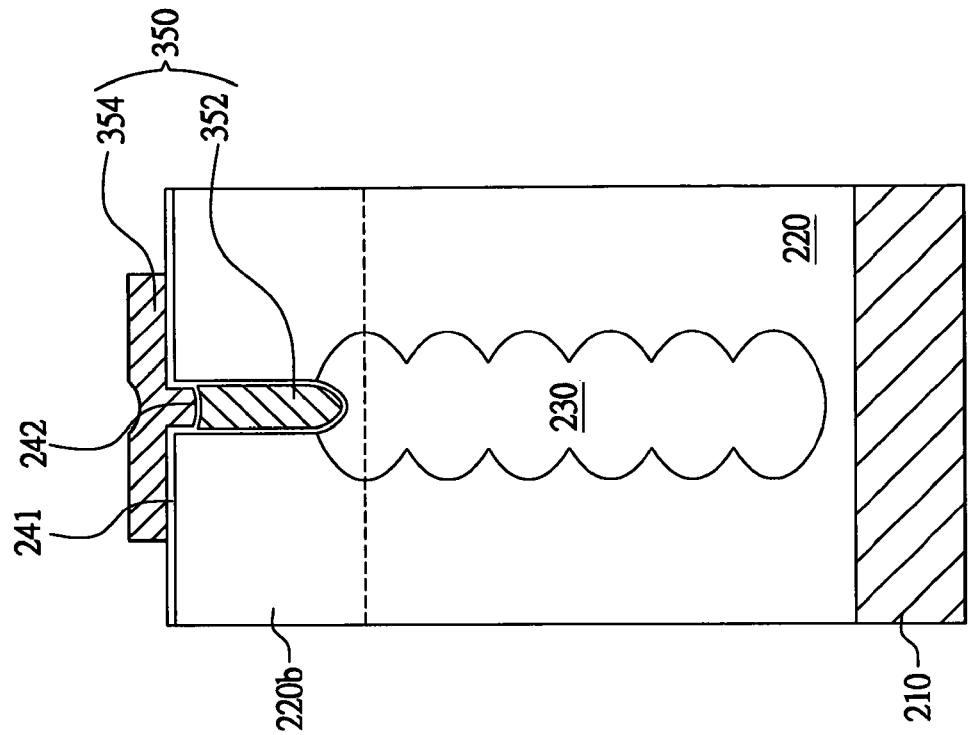
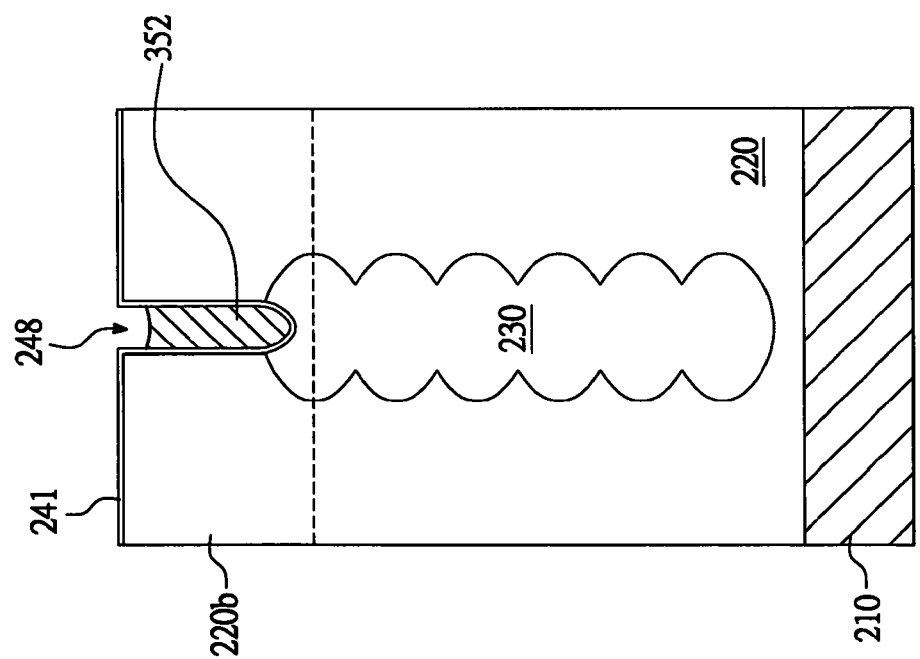
Fig. 6B
Fig. 6A

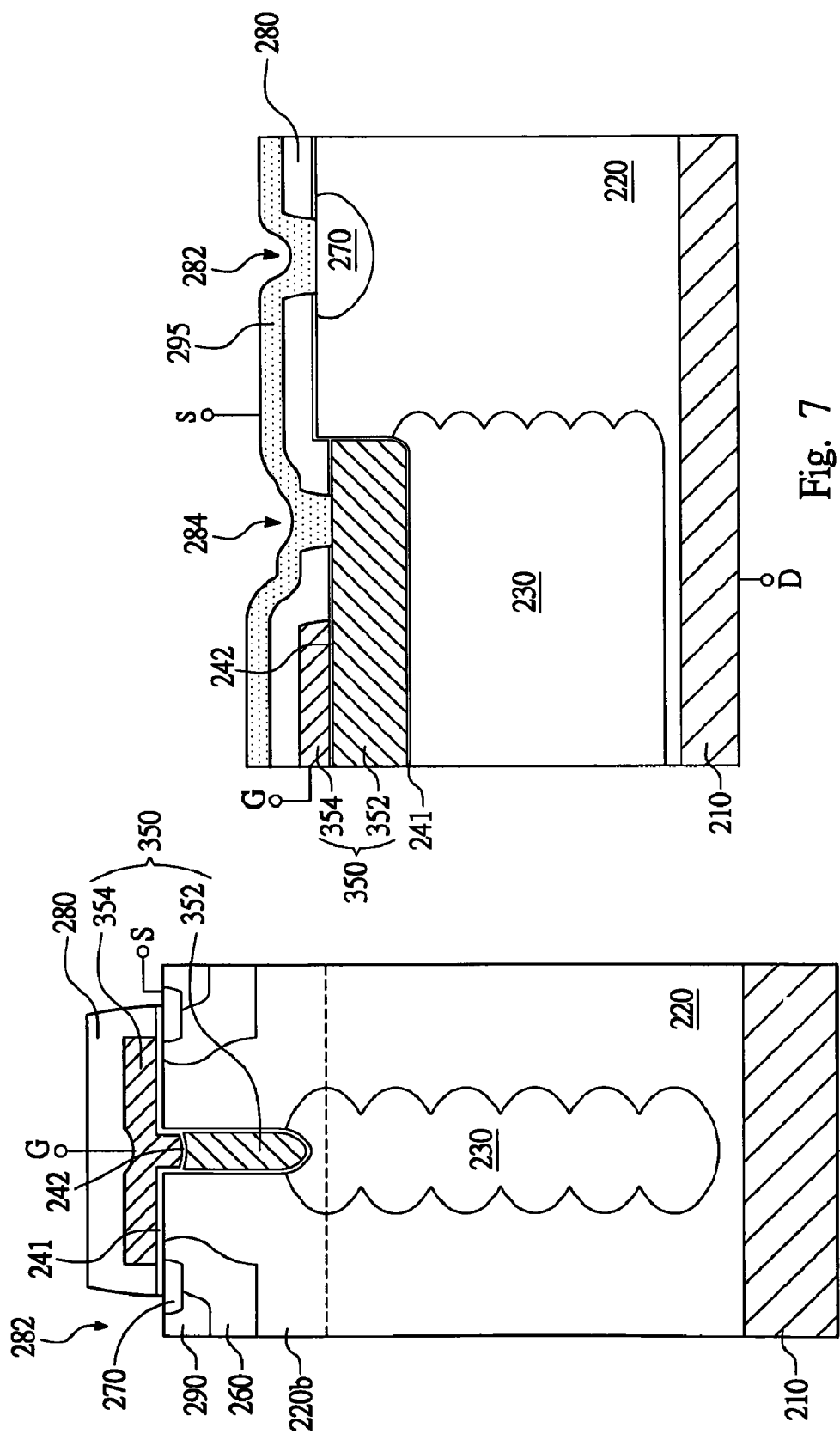

HIGH-VOLTAGE METAL OXIDE SEMICONDUCTOR DEVICE AND FABRICATION METHOD THEREOF

BACKGROUND OF THE INVENTION

1. Field of the Invention

This invention relates to a high-voltage metal oxide semiconductor device and a fabrication method thereof, and more particularly relates to a high-voltage metal oxide semiconductor device with a vertical well and a fabrication method thereof.

2. Description of Related Art

Among various power semiconductor devices, the metal oxide semiconductor field effect transistor, with the advantages of fast switching, low switching loss, and low driving loss, has been widely used for high-frequency power conversion. However, it is hard for the traditional power semiconductor device to withstand high voltage. In order to enhance withstanding voltage, on-resistance of the power semiconductor may increase disproportionately, which results in huge conduction loss and also seriously restricts the application of the power semiconductor device.

Referring to FIGS. 1 and 1A, on-resistance of the traditional high-voltage semiconductor field effect transistor ($R_{DS(on)}$) is dominated by the resistance of the drift zone, which includes $R_{ch}$, $R_a$, and $R_{epi}$ as shown. The voltage blocking capability of the high-voltage semiconductor field effect transistor is mainly decided by the distance of the drift zone and the doping. That is, in order to increase withstanding voltage, the epitaxial layer should be thickened and the doping concentration should be lightened. However, the thickened epitaxial layer and the lightened doping concentration results in disproportionate increasing of on-resistance.

The percentage of the epitaxial layer contributed to the overall on-resistance varies with the withstanding voltage. As shown, for the metal oxide semiconductor designed to withstand the voltage ($V_{GD}$) of 30V, the epitaxial layer contributes only 29% of the total on-resistance, whereas, for the metal oxide semiconductor designed to withstanding the voltage ($V_{GD}$) of 600V, the epitaxial layer contributes 96.5% of the total on-resistance.

There are two typical methods to reduce the total on-resistance of the high-voltage metal oxide semiconductor device. The first one is to increase the cross-section area of the transistor so as to reduce on-resistance crossing the epitaxial layer. However, the integration density must be reduced and the cost is increased. The other one is to introduce minority carriers. However, this method not only slow down the switching speed but also result in the existence of tail current that increases switching loss.

Since both the above two methods have the unsolvable drawbacks, it is eager to find out a new high-voltage metal oxide semiconductor device with both low on-resistance and high voltage blocking capability.

SUMMARY OF THE INVENTION

It is an object of the present invention to provide a high-voltage metal oxide semiconductor device with low on-resistance for reducing power loss and high voltage blocking capability.

A high-voltage metal oxide semiconductor device is provided in the present invention. The high-voltage metal oxide semiconductor device comprises a main body of a first conductivity type, a conductive structure, a first well of a second conductivity type, a source region of the first conductivity type, and a second well of the second conductivity type. The conductive structure has a first portion and a second portion. The first portion is extended from an upper surface of the main body into the main body. The second portion is extended along the upper surface of the main body. The first well is located in the main body and below the second portion. The first well is kept away from the first portion with a predetermined distance. The source region is located in the first well. The second well is located in the main body and extends from a bottom of the first portion to a place close to a drain region.

In an embodiment of the present invention, the first portion is connected to the second portion and the second portion is electrically connected to a gate electrode.

In an embodiment of the present invention, the first portion and the second portion are separated by a dielectric layer. The first portion is electrically connected to a gate electrode, whereas the second portion is electrically connected to the source region.

A fabrication method of a high-voltage metal oxide semiconductor device is also provided in the present invention. The fabrication method comprises the steps of: (a) providing a substrate; (b) forming a first epitaxial layer of a first conductivity type on the substrate; (c) defining a doping region in the first epitaxial layer by using a mask and implanting dopants of a second conductivity type in the first epitaxial layer to form a first doped region; (d) repeating steps (b) and (c) more than once; (e) forming a second epitaxial layer of the first conductivity type on the first epitaxial layers; (f) forming a trench exposing the uppermost first doped region; (g) forming a conductive structure with a first portion and a second portion on the second epitaxial layer, the first portion located in the trench, and the second portion extended along an upper surface of the second epitaxial layer; (h) implanting dopants of the second conductivity type in the second epitaxial layer by using the conductive structure as a mask to form a plurality of first wells, which is away from the first portion with a predetermined distance; and (i) forming a plurality of source regions of the first conductivity type in the first wells.

Another high-voltage metal oxide semiconductor device is provided in the present invention. The high-voltage metal oxide semiconductor device comprises a main body of a first conductivity type, a gate conductive layer, two first wells of a second conductivity type, two source regions of the first conductivity type, and a second well of the second conductivity type. The gate conductive layer extends along an upper surface of the main body. The two first wells are located in the main body and corresponding to the two opposite edges of the gate conductive layer respectively. The two source regions are located in the two first wells and beneath the two opposite edges of the gate conductive layer respectively. The second well is located in the main body and extended beneath the gate conductive layer to a place close to a substrate. The second well should be electrically connected to a gate electrode or a source electrode. The second well is away from the two first wells with a predetermined distance. In addition, the distance between the second well and the gate conductive layer is greater than depth of the first well.

Another fabrication method of a high-voltage metal oxide semiconductor device is provided in the present invention. The fabrication method comprises the steps of: (a) providing a substrate; (b) forming a first epitaxial layer of a first conductivity type on the substrate; (c) defining a doping region in the first epitaxial layer by using a mask and implanting dopants of a second conductivity type in the first epitaxial layer to form a first doped region; (d) repeating steps (b) and (c) more than once; (e) forming a second epitaxial layer of the first conductivity type on the first epitaxial layers, wherein the first doped regions are expanded by heat and mutually connected to form a vertical well; (f) forming a guard ring of the second conductivity type in the second epitaxial layer to define an active region, and the guard ring being planarly overlapped with the vertical well; (g) forming a gate conductive layer on an upper surface of the second epitaxial layer and aligned to the vertical well; (h) implanting dopants of the second conductivity type in the second epitaxial layer by using the gate conductive layer as a mask and driving in the dopants to form a plurality of first wells away from the vertical well with a predetermined distance, meanwhile, the guard ring being expanded downward to connect to the vertical well; and (i) forming a plurality of source regions of the first conductivity type in the first wells

BRIEF DESCRIPTION OF THE DRAWINGS

The present invention will now be specified with reference to its preferred embodiment illustrated in the drawings, in which:

FIGS. 1 and 1A show the contribution of different portions in the traditional high-voltage semiconductor field effect transistor to the overall on-resistance under different withstanding voltage;

FIGS. 2A and 2B are schematic cross-section view showing a preferred embodiment of a high-voltage metal oxide semiconductor device in accordance with the present invention;

FIGS. 6A to 6E are schematic views showing another preferred embodiment of the fabrication method of a high-voltage metal oxide semiconductor device in accordance with the present invention;

FIG. 7 is a schematic cross-section view showing a preferred embodiment of the first portion of the conductive structure of FIG. 6E being electrically connected to the source region in accordance with the present invention;

DETAILED DESCRIPTION OF PREFERRED EMBODIMENT

Figure 2B:
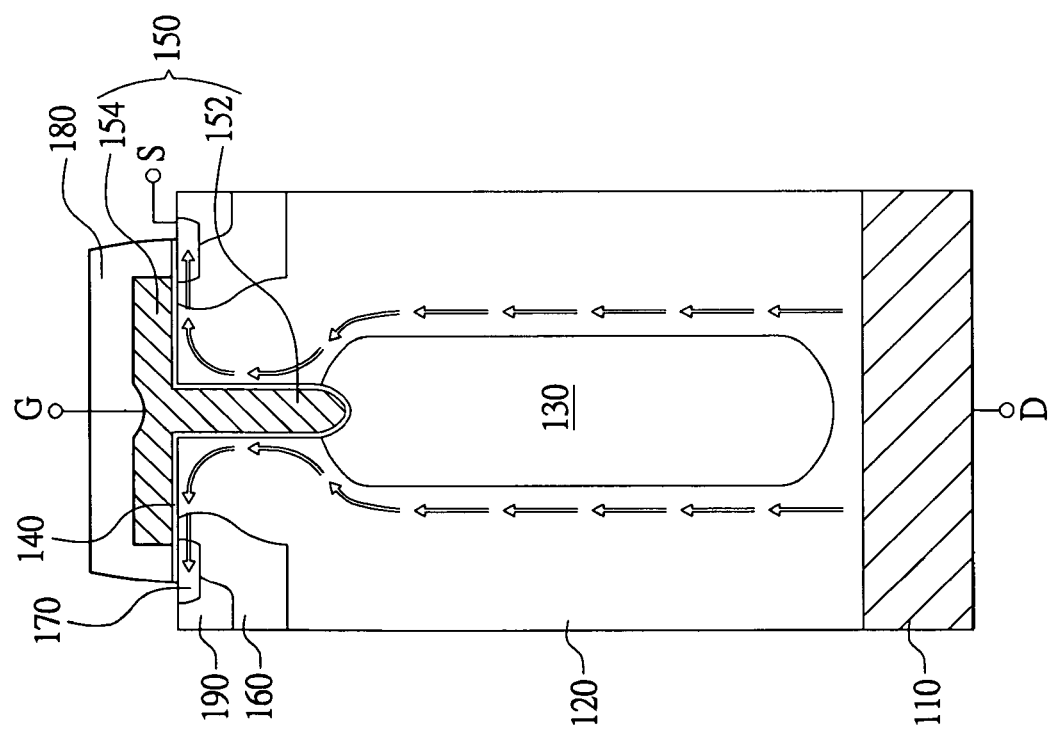

FIGS. 2A and 2B are schematic views showing a preferred embodiment of a high-voltage metal oxide semiconductor device in accordance with the present invention. An N-type metal oxide semiconductor device field effect transistor (MOSFET) is described below as an example. As shown, the high-voltage metal oxide semiconductor device has an N-type epitaxial layer 120, a conductive structure 150, a P-type first well 160, an N-type source region 170, and a P-type second well 130. The N-type epitaxial layer 120 is located on an N-type substrate 110 as the main body of the high-voltage metal oxide semiconductor device. The conductive structure 150 is located on the N-type epitaxial layer 120. The conductive structure 150 showing a T-shaped cross-section has a first portion 152 and a second portion 154. The first portion 152 is extended from an upper surface of the N-type epitaxial layer 120 into the N-type epitaxial layer 120. The second portion 154 is extended along the upper surface of the N-type epitaxial layer 120. The conductive structure 150 is electrically connected to a gate electrode G.

The P-type first well 160 is located in the N-type epitaxial layer 120 below the second portion 154 of the conductive structure 150. In addition, the first well 160 is kept away from the first portion 152 of the conductive structure 150 with a predetermined distance. That is, there is an N-type area interposed between the P-type first well 160 and the first portion 152 of the conductive structure 150. The N-type source region 170 is located in the P-type first well 160 and is corresponding to the edge of the second portion 154 of the conductive structure 150. The N-type source region 170 and the N-type epitaxial layer 120 are separated by the P-type first well 160. The source region 170 is electrically connected to a source electrode S.

The P-type second well 130 is located in the epitaxial layer 120 and is extended from a bottom of the first portion 152 downward to a place close to the N-type substrate 110. The bottom of the P-type second well 130 and the N-type substrate 110 are separated by N-type area with enough thickness. In addition, the P-type second well 130 is not in contact with the first portion 152 of the conductive structure 150. The P-type second well 130 is separated from the first portion 152 by at least one oxide layer 140. However, the P-type second well 130 can't be far away from the first portion 152 of the conductive structure 150. In order to ensure that the charges in the second well 130 can be induced by the potential of the first portion 152, the P-type second well 130 should be adjacent to the first portion 152. Moreover, there should be an N-type area with enough thickness left between the P-type second well 130 and the P-type first well 160 as a conduction path when the metal oxide semiconductor device is conducting.

Referring to FIG. 2A, as the voltage difference ($V_{GS}$) between the gate electrode G and the source electrode S of the metal oxide semiconductor device is smaller than a threshold voltage ($V_{TH}$), the channel connecting the source region 170 and the N-type epitaxial layer 120 does not exist in the P-type first well 160. Meanwhile, when a forward bias is applied between the drain electrode D and the source electrode S, the range of the depletion region on the interface between the P-type first well 160, which is electrically connected to the source electrode S, and the N-type epitaxial layer 120, which is electrically connected to the drain D, is expanded as the dashed line shows.

It is noted that the voltage levels of the gate electrode G and the source electrode S are substantially the same when the metal oxide semiconductor device is turned off. The forward bias applied between the drain electrode D and the source electrode S also expands the depletion region on the interface between the P-type second well 130, which is adjacent to the conductive structure 150 to access the potential of the gate electrode G, and the N-type epitaxial layer 120, which is electrically connected to the drain electrode D, as the dashed line shows. The depletion regions formed on the interfaces between the first well 160 and the epitaxial layer 120 and between the second well 130 and the epitaxial layer 120 may block the conduction path from the N-type substrate 110 to the source region 170. Because the depletion region shows perfect voltage blocking capability, the withstanding voltage of the metal oxide semiconductor device is thus enhanced dramatically.

Referring to FIG. 2B, when the voltage difference ($V_{GS}$) between the gate electrode G and the source electrode S is greater than a threshold voltage ($V_{TH}$), a channel is formed in the P-type first well 160 under the second portion 154 to connect the N-type source region 170 and the N-type epitaxial layer 120. At this time, free electrons in the source region 170 are injected into the depletion region through the channel to recover the conductivity of the N-type epitaxial layer 120 to form the conduction path extended from the source region 170, through the channel under the second portion 154, turned downward by the side of the first portion 152 and the second well 130 to the N-type substrate 110.

As shown, for a preferred embodiment, the width of the second well 130 is greater than the width of the first portion 152 to restrict the thickness of N-type area interposed between the first well 160 and the second well 130 so as to control the time needed to retrieve the conductivity of the N-type epitaxial layer 120 when the metal oxide semiconductor device is turned on. In addition, the upper edge of the second well 130 covers the bottom of the first portion 152 of the conductive structure 150 to ensure that the charges in the second well 130 can quickly respond the potential of the first portion 152. Moreover, withstanding voltage of the high-voltage metal oxide semiconductor device in accordance with the present invention is positively dependent to the extending distance of the second well 130. The extending distance of the second well 130 should be much greater than the length of the first portion 152 in practice.

The above mentioned embodiment describes a high-voltage metal oxide semiconductor field effect transistor. However, the scope of the present invention should not be limited thereto. For example, if the N-type substrate 110 in the above mentioned embodiment is replaced by a P-type substrate, an insulated gate bipolar transistor (IGBT) in accordance with the present invention is shown.

Figure 3:
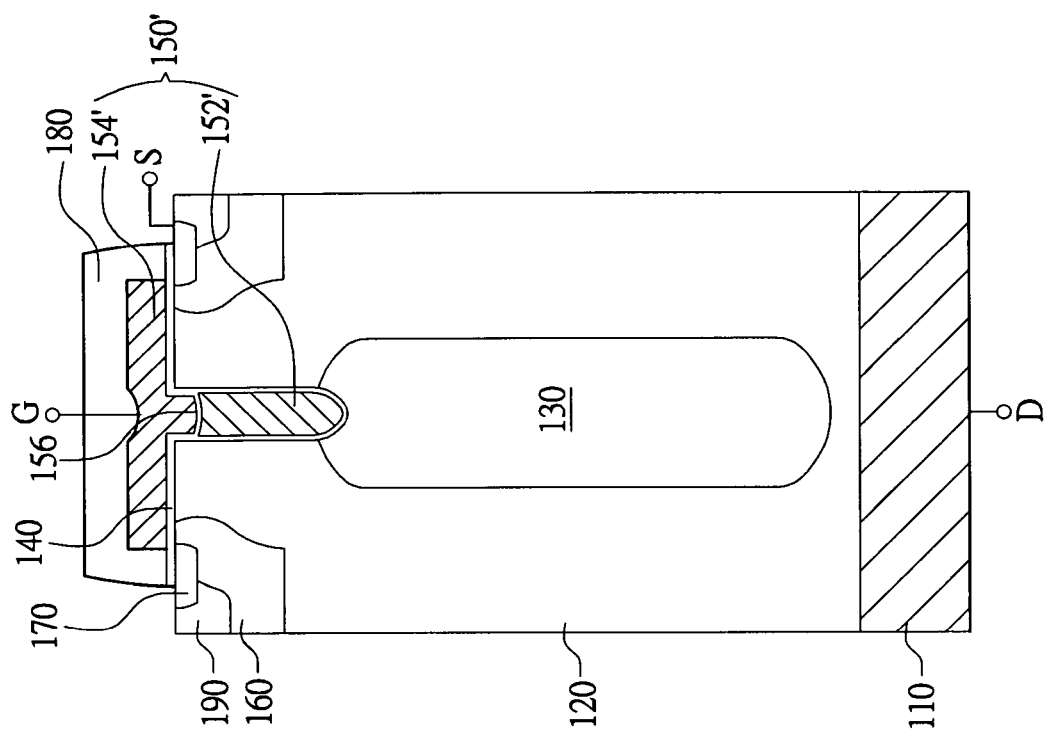
FIG. 3 is a schematic cross-section view showing another preferred embodiment of the high-voltage metal oxide semiconductor device in accordance with the present invention.

FIG. 3 is a schematic view showing another preferred embodiment of the high-voltage metal oxide semiconductor device in accordance with the present invention. In contrast with the embodiment as shown in FIGS. 2A and 2B, the conductive structure 150' in the present embodiment has an dielectric layer 156, such as an oxide layer, interposed between the first portion 152' and the second portion 154' so as to electrically isolate the first portion 152' and the second portion 154'. Moreover, in the present embodiment, the second portion 154' of the conductive structure 150' is electrically connected to the gate electrode G, whereas the first portion 152' of the conductive structure 150' is electrically connected to the source electrode S.

Referring to FIGS. 2A and 2B, potential of the second well 130 of the high-voltage metal oxide semiconductor device is decided by the potential of the gate electrode G. In contrast, potential of the second well 130 of the present embodiment is decided by the potential of the source electrode S. When the high-voltage metal oxide semiconductor device is turned off and the voltage difference ($V_{GS}$) between the gate electrode G and the source electrode S is smaller than the threshold voltage ($V_{TH}$), there are depletion regions formed on the interfaces between the P-type first well 160 and the N-type epitaxial layer 120 and between the P-type second well 130 and the N-type epitaxial layer 120 to block the conduction path from the N-type substrate 110 to the source region 170 and provide perfect voltage blocking capability.

Figure 4C:
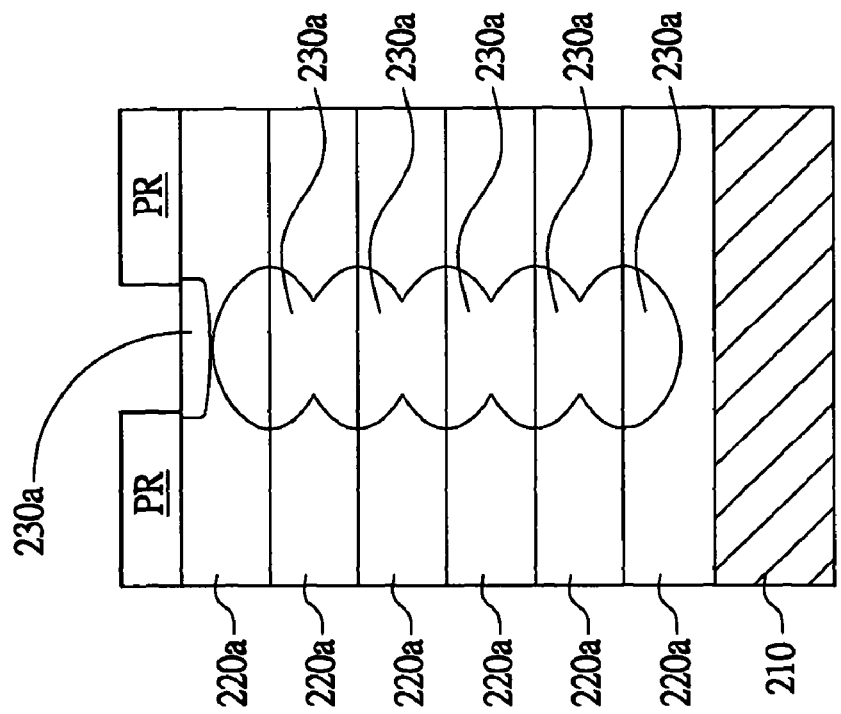
FIGS. 4A to 4H are schematic views showing a preferred embodiment of the fabrication method of a high-voltage metal oxide semiconductor device in accordance with the present invention.
Figure 4A:
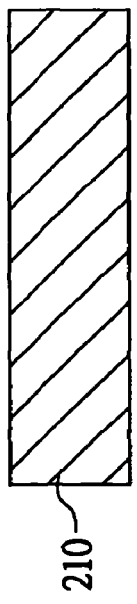
Figure 4B:
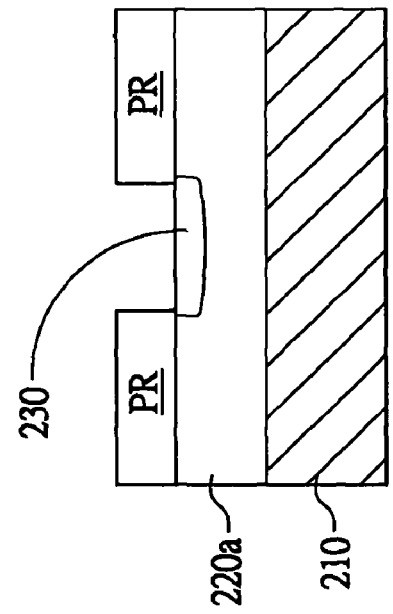
Figure 4E:
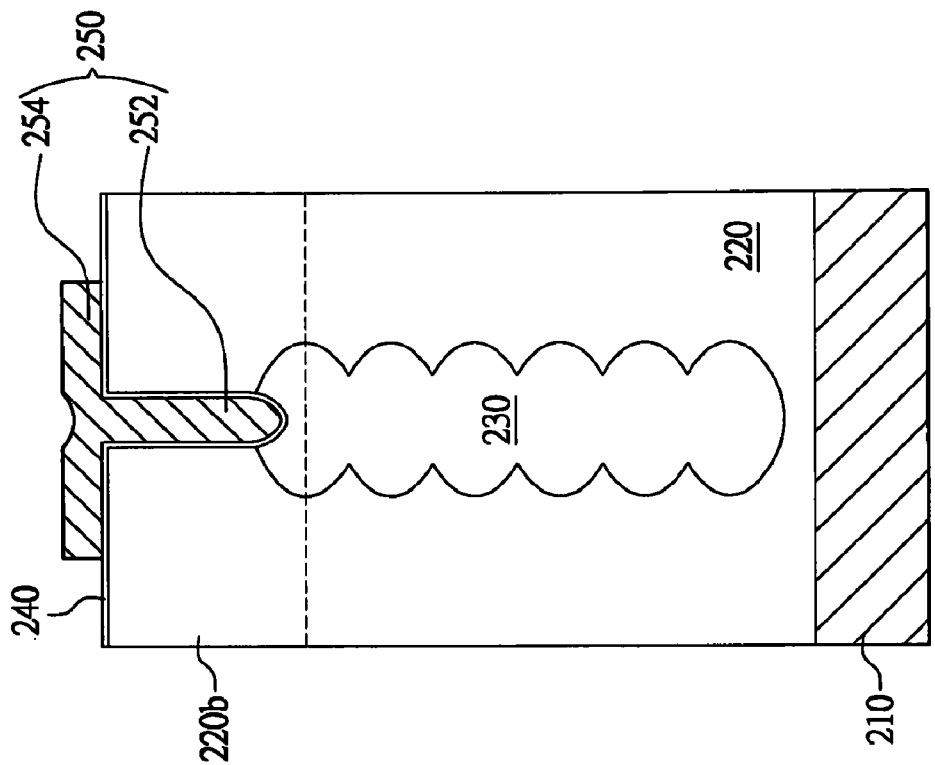

FIGS. 4A to 4H are schematic views showing a preferred embodiment of the fabrication method of a high-voltage metal oxide semiconductor device in accordance with the present invention. The fabrication method of an N-type metal oxide semiconductor device is shown as an example. Referring to FIG. 4A, firstly, an N-type substrate 210 is provided. Then, as shown in FIG. 4B, an N-type first epitaxial layer 220a is formed on the substrate 210. Afterward, a photoresist pattern layer PR is formed on the first epitaxial layer 220a by using a mask to define a doping region in the first epitaxial layer 220a. P-type dopants are then implanted in the first epitaxial layer 220a through the photoresist pattern layer PR to form a P-type first doped region 230a.

Afterward, as shown in FIG. 4C, the fabrication steps of FIG. 4B, including the steps of forming the N-type first epitaxial layer 220a and forming the P-type first doped region 230a, are repeated more than once. The number of repeated cycles is positive correlated to the withstanding voltage of the high-voltage metal oxide semiconductor. For example, as the metal oxide semiconductor device is designed to withstand a voltage of 600V, the fabrication steps of FIG. 4B are repeated six times to stack six first epitaxial layers 200a on the substrate 210 with six first doped regions 230a formed therein.

The fabrication steps of FIG. 4B needs a mask to define the doping region in the first epitaxial layer 220a. In the present embodiment, the repeated fabrication steps use the same mask for defining the first doped regions 230a in each of the first epitaxial layers 220a so that size of the first doped regions 230a are substantially the same and the first doped regions are vertically aligned. In addition, because the epitaxial layer is grown at a high temperature, the range of the first doped regions 230a would be expanded by heat during the step of growing epitaxial layers. In the present embodiment, as shown in FIG. 4C, by properly controlling the depth and concentration of the implanted dopants as well as the thickness of the respective first epitaxial layer 220a, the first doped regions 230a in the first epitaxial layers 220a are able to connect with each other to form a single P-type vertical well 230 (corresponding to the second well 130 in FIGS. 2A and 2B). However, a predetermined distance must be kept between the P-type vertical well 230 and the N-type substrate 210.

Figure 4D:
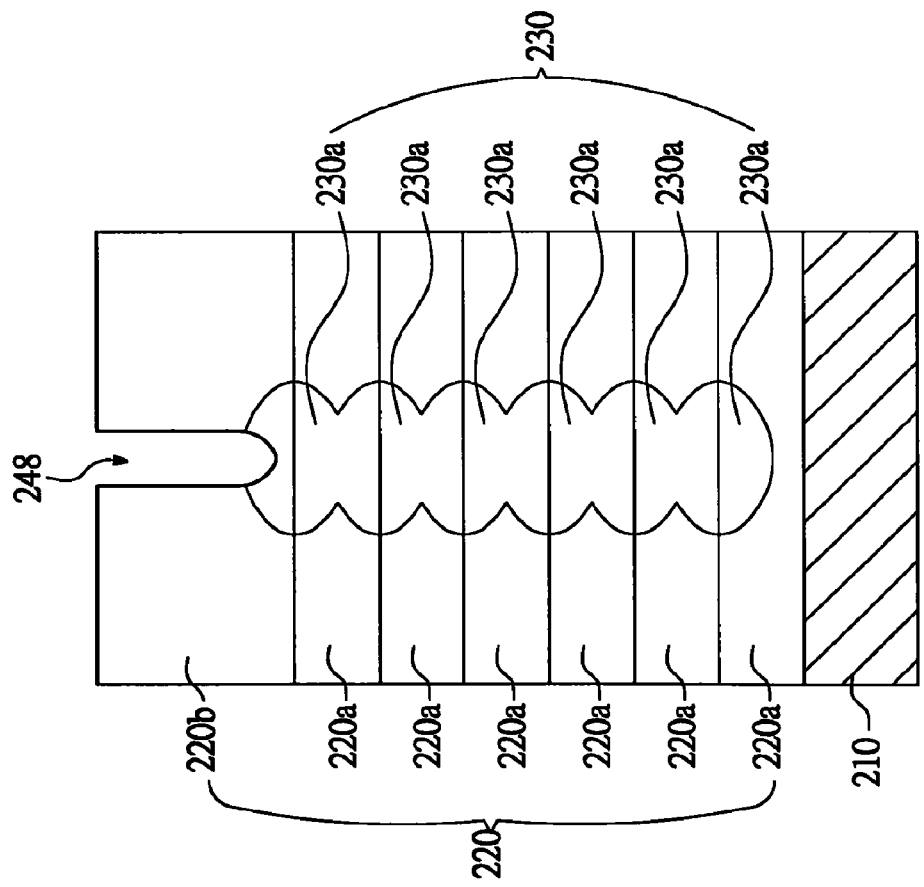

Afterward, referring to FIG. 4D, an N-type second epitaxial layer 220b is formed on the stacked first epitaxial layers 220a. The second epitaxial layer 220b and the stacked first epitaxial layers 220a compose an epitaxial layer 220 as the main body of the metal oxide semiconductor device. Thereafter, a trench 248 is formed in the epitaxial layer 220 to expose the uppermost first doped region 230a (or the upper edge of the P-type vertical well 230). Afterward, referring to FIG. 4E, an oxide layer 240 is formed on the exposed surface of the second epitaxial layer 220b. Then, a conductive layer, such as a polysilicon layer (not shown), is deposited on the second epitaxial layer 220b and fills the trench 248. After using a mask to define the conductive structure 250 in the polysilicon layer and removing the unwanted polysilicon material by etching, the conductive structure 250 has a first portion 252 and a second portion 254 is formed on the second epitaxial layer 220b. As shown, the first portion 252 is located in the trench 248 and the second portion 254 is extended along the upper surface of the epitaxial layer 220b.

Figure 4G:
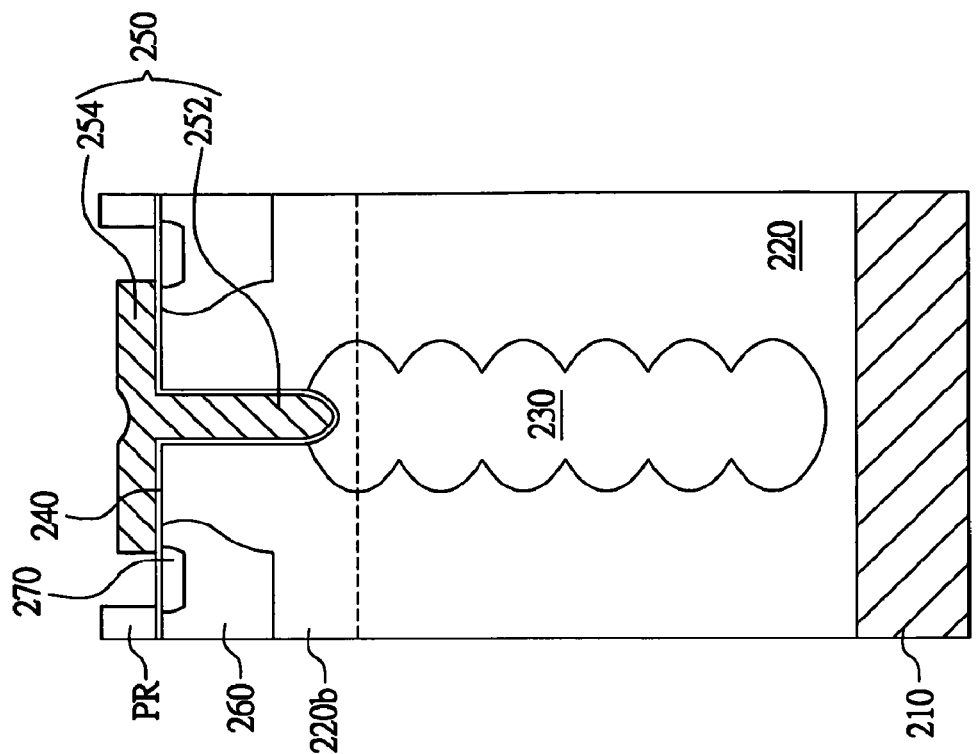
Figure 4F:
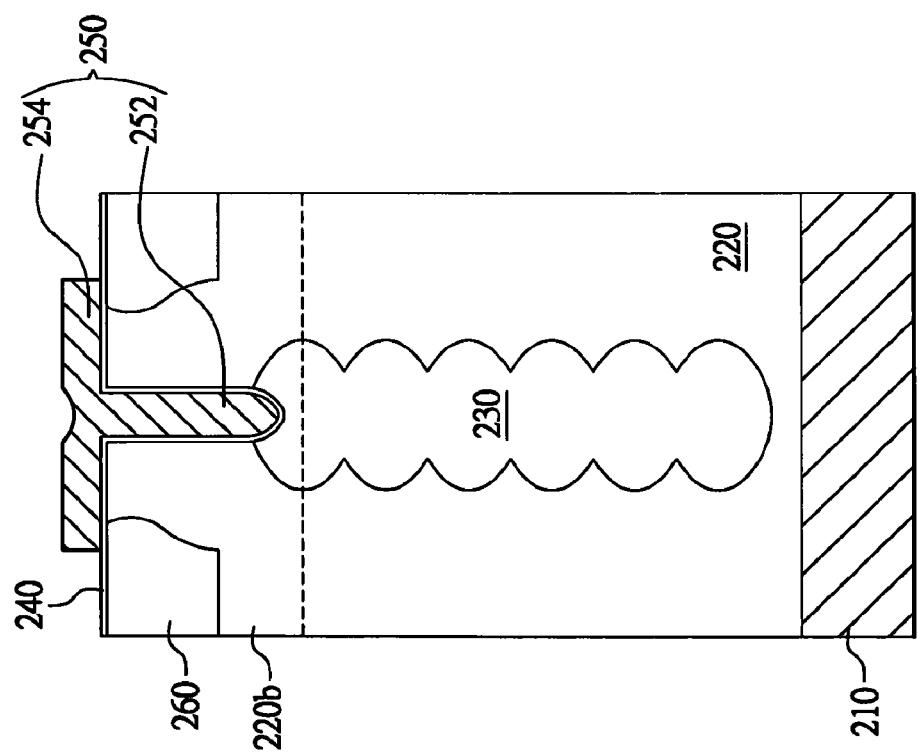

Afterward, referring to FIG. 4F, P-type dopants are implanted in the second epitaxial layer 200b by using the conductive structure 250 as a mask so that a plurality of P-type first wells 260 away from the first portion 252 with a predetermined distance is formed in the epitaxial layer 220. That is, there is an N-type area located between the first well 260 and the first portion 252. In addition, there is also an N-type area with enough width located between the P-type first well 260 and the P-type vertical well 230 acting as the conduction path when the metal oxide semiconductor is turned on.

Figure 4H:
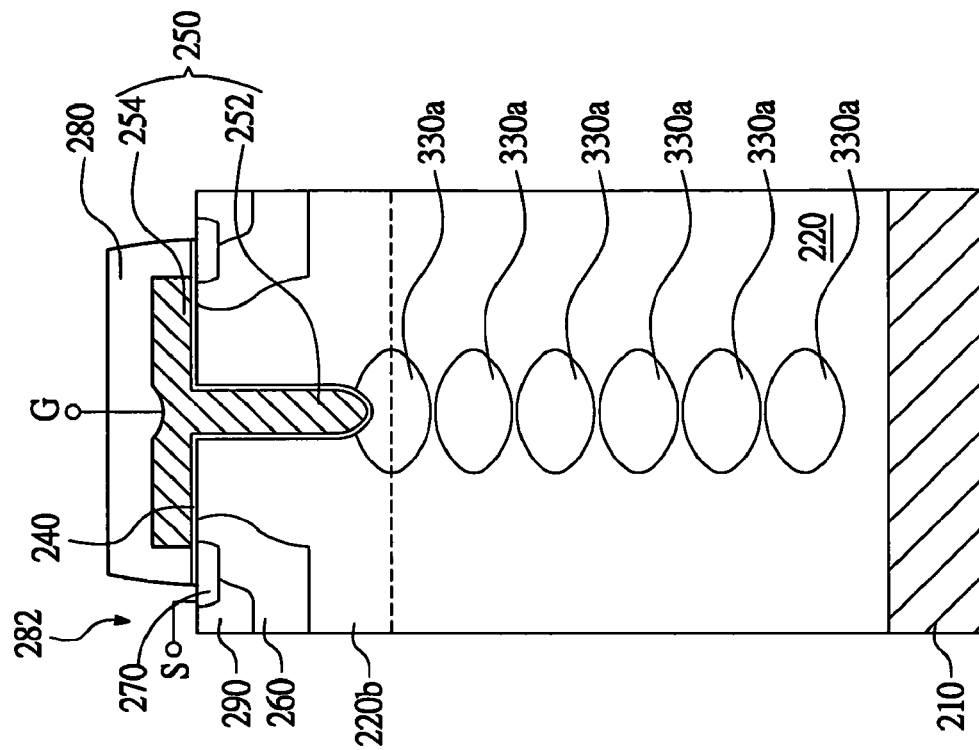

Afterward, referring to FIG. 4G, a photoresist pattern layer PR is formed on the first wells 260 by using a source mask (not shown) to define a plurality of the source regions 270. Then, N-type dopants are implanted through the photoresist pattern layer PR to form the source regions 270 in the first wells 260, respectively. Thereafter, as shown in FIG. 4H, a dielectric layer 280 is deposited over the exposed surface. Then, a plurality of contact windows 282 are formed in the dielectric layer 280 to expose the source regions 270 and the first wells 260 under the dielectric layer 280. Afterward, P-type dopants are implanted in the first wells 260 by using the dielectric layer 280 as a mask to form a plurality of P-type heavily doped regions 290 in the first wells 260 respectively.

Figure 5:
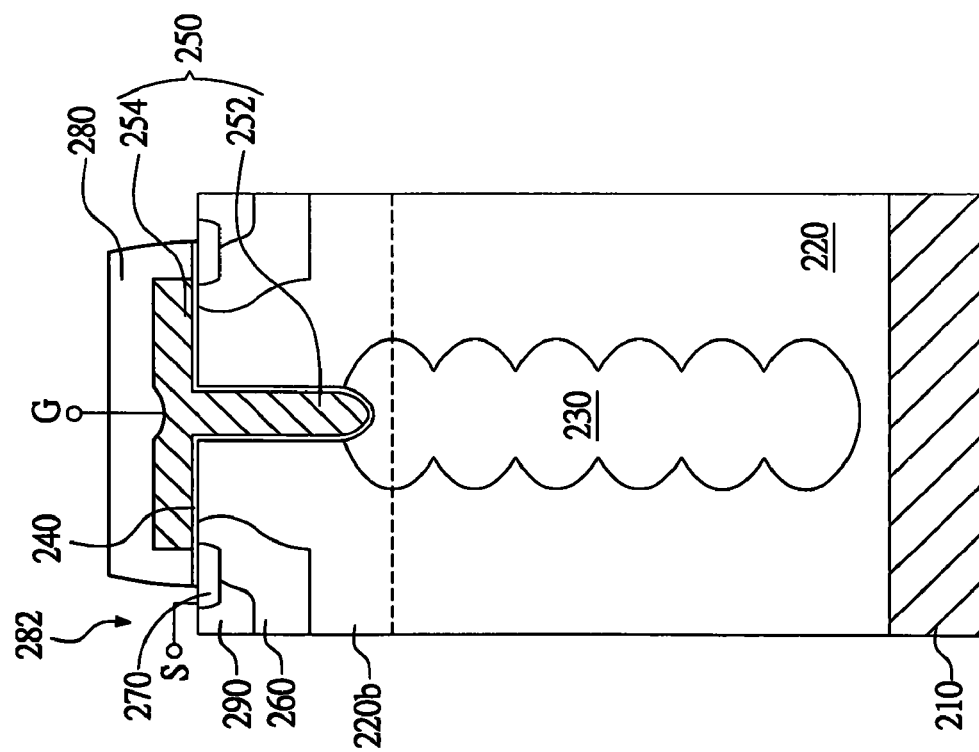
FIG. 5 is a schematic view of another preferred embodiment of the high-voltage metal oxide semiconductor in accordance with the present invention.

Referring to FIG. 4H, in the above mentioned embodiment, the first doped regions 230a in the epitaxial layer 220 are connected with each other to form a vertical well 230. However, it should not be used to restrict the scope of the present invention. For example, referring to FIG. 5, each of the first doped regions 330a in the epitaxial layer 220 may be separated with each other under the limitation that the spacing between neighboring first doped regions 330a should be small enough to ensure that the charges of each of the first doped regions 330a can be induced by the first portion 252 of the conductive structure 250.

FIGS. 6A to 6E are schematic views showing another preferred embodiment of a high-voltage metal oxide semiconductor device in accordance with the present invention. Following the step of FIG. 4D, referring to FIG. 6A, a first oxide layer 241 is then formed on the exposed surface of the second epitaxial layer 220b. Afterward, a first polysilicon layer is deposited on the second epitaxial layer 220b as a whole and fills the trench 248. Part of the first polysilicon layer is then removed by etching back and only the polysilicon material in the trench 248 is left to construct the first portion 352 of the conductive structure 350.

Afterward, referring to FIG. 6B, a second oxide layer 242 is formed on the exposed surface of the first portion 352. Then, a second polysilicon layer is deposited as a whole to cover the second oxide layer 242. Thereafter, the second portion 354 of the conductive structure 350 is defined by using a mask (not shown) and the unwanted polysilicon material is removed so as to form the second portion 354 of the conductive structure 350.

Figure 6D:
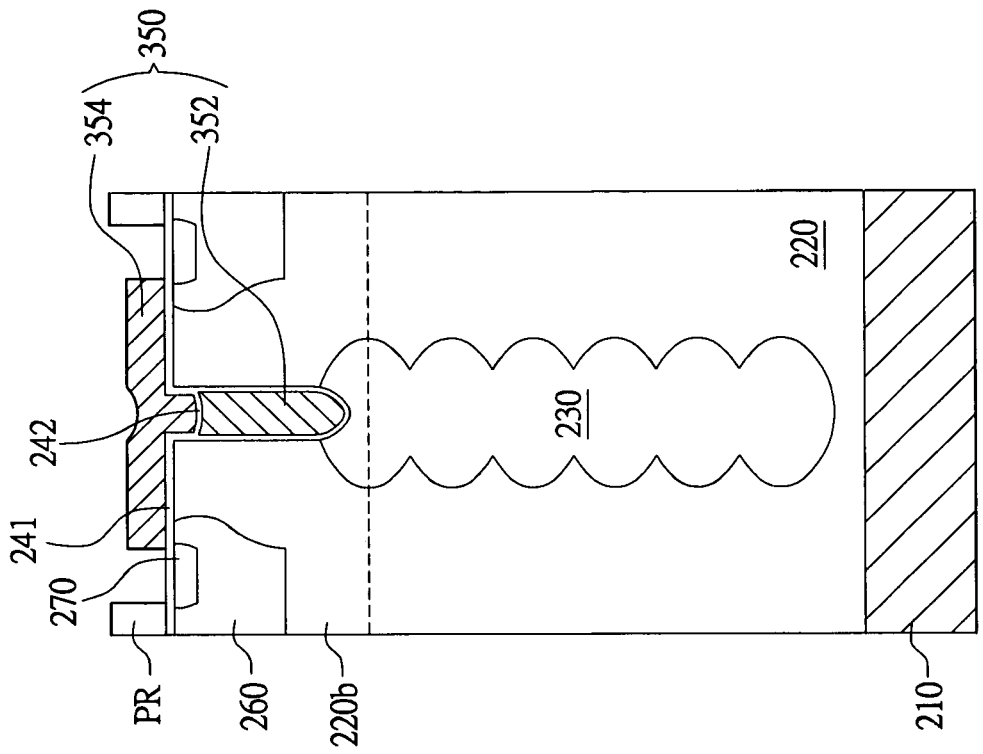
Figure 6C:
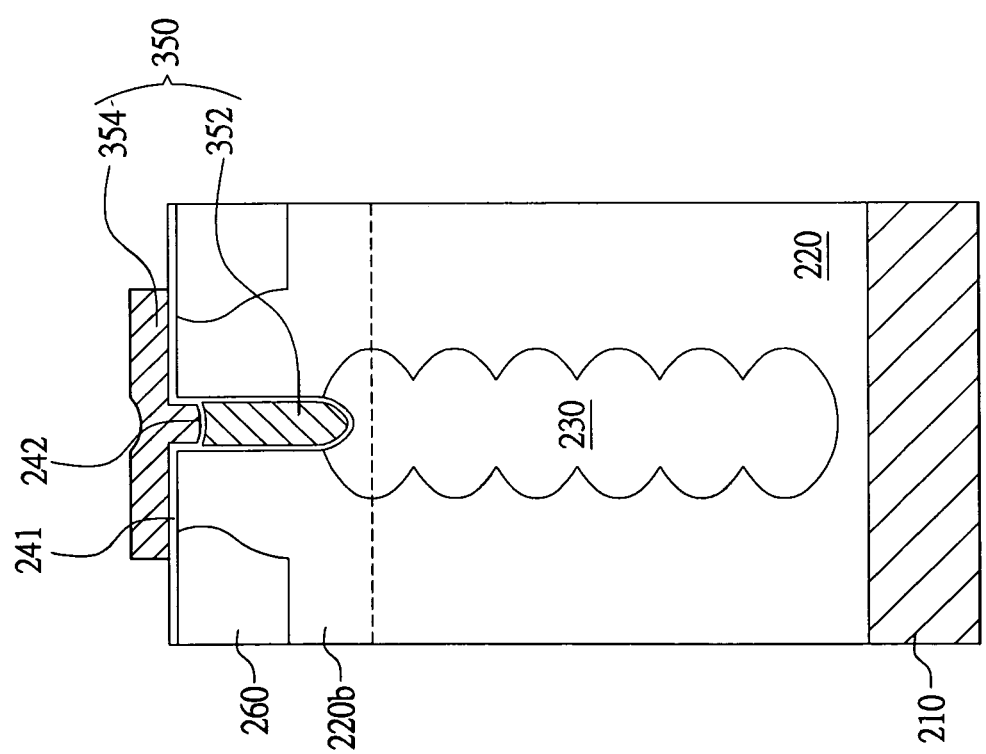

Afterward, referring to FIG. 6C, P-type dopants are implanted in the second epitaxial layer 220b directly by using the second portion 354 of the conductive structure 350 as a mask so as to form a plurality of first wells 260. Thereafter, referring to FIG. 6D, a photoresist pattern layer PR is formed on the first wells 260 to define a plurality of source regions 270. Then, N-type dopants are implanted in the first wells 260 to form the source regions in the first wells respectively. Thereafter, as shown in FIG. 6E, a dielectric layer 280 is deposited over the exposed surface. Then, a plurality of contact windows 282 are formed in the dielectric layer 280 to expose the source regions 270 and the first wells 260 under the dielectric layer 280. Afterward, P-type dopants are implanted in the first wells 260 by using the dielectric layer 280 as a mask to form a plurality of P-type heavily doped regions 290 in the first wells 260 respectively.

Referring to FIGS. 6A and 6B, the first portion 352 and the second portion 354 of the conductive structure 350 are separated by the second oxide layer 242. The second portion 354 is electrically connected to the gate electrode G to control the switching of the metal oxide semiconductor device, whereas the first portion 352 may be electrically connected to the source electrode S. Referring to FIG. 7, in order to electrically connect the first portion 352 and the source electrode S, as a preferred embodiment, there is an opening 284 formed in the dielectric layer 280 adjacent to the edge of the high-voltage metal oxide semiconductor device to expose the first portion 352 and a source metal layer 295 connecting the source regions 270 is filled into the opening 284 to connect the first portion 352.

Figure 8:
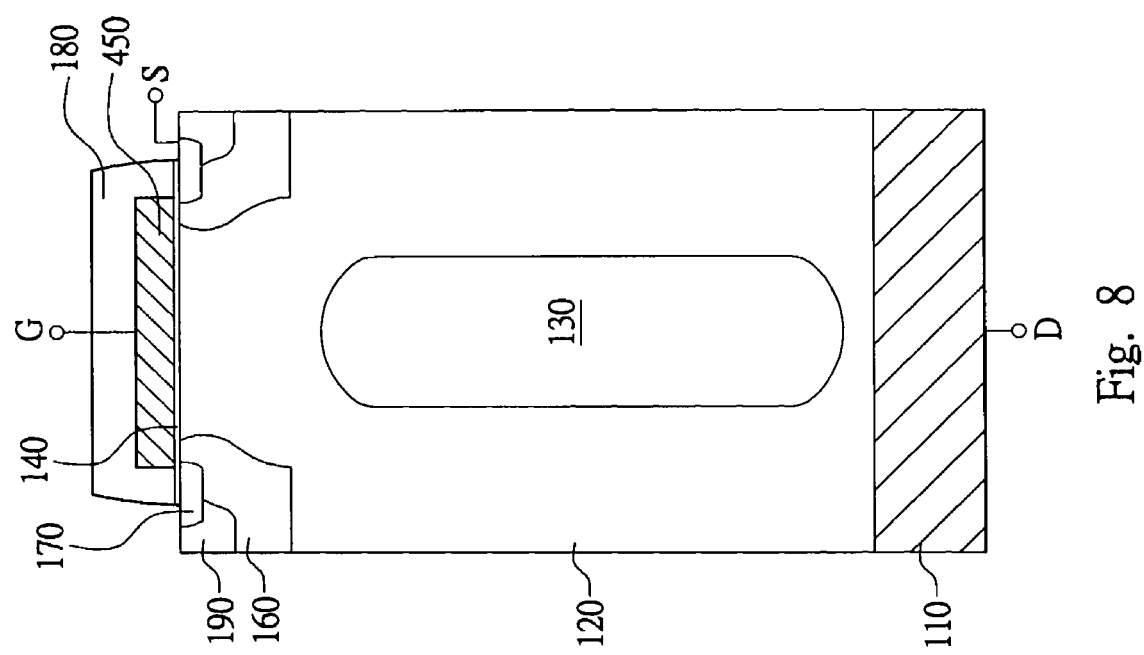
FIG. 8 is a schematic cross-section view showing still another preferred embodiment of the high-voltage metal oxide semiconductor device in accordance with the present invention.

FIG. 8 is a schematic view showing another preferred embodiment of the high-voltage metal oxide semiconductor device in accordance with the present invention. An N-type high-voltage metal oxide semiconductor field effect transistor is described below as an example. As shown, the high-voltage metal oxide semiconductor device has an N-type epitaxial layer 120, a gate conductive layer 450, two P-type first wells 160, two N-type source regions 170, and a P-type second well 130. The N-type epitaxial layer 120 is located on an N-type substrate 110 as a main body of the high-voltage metal oxide semiconductor device. The gate conductive layer 450 is extended along the upper surface of the N-type epitaxial layer 120. The two first wells 160 are located in the N-type epitaxial layer 120 and corresponding to the two opposite edges of the gate conductive layer 450 respectively. In addition, the two first wells 160 are spaced apart from each other.

The two source regions 170 are located in the two first wells 160 and beneath the two opposite edges of the gate conductive layer 450, respectively. The P-type second well 130 is located in the N-type epitaxial layer 120 and extended beneath the gate conductive layer 450 to a place close to the N-type substrate 110, which may be regarded as an N-type drain region. The P-type second well 130 is away from the two P-type first wells 160 with a predetermined distance and is electrically connected to the gate electrode G or the source electrode S. As a preferred embodiment, the distance between the second well 130 and the gate conductive layer 450 should be greater than the depth of the first well 160.

Figure 9A:
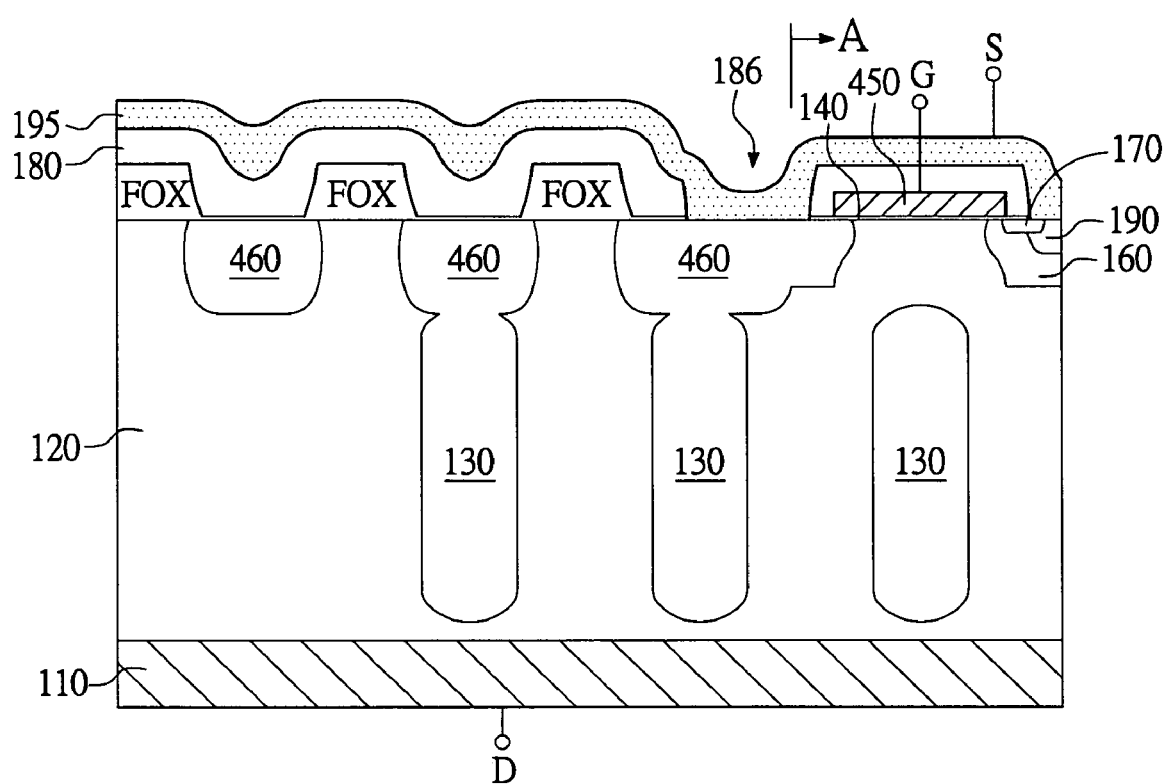
FIG. 9A is a schematic cross-section view showing a preferred embodiment of the second well of FIG. 8 being electrically connected to the source electrode in accordance with the present invention.
Figure 9B:
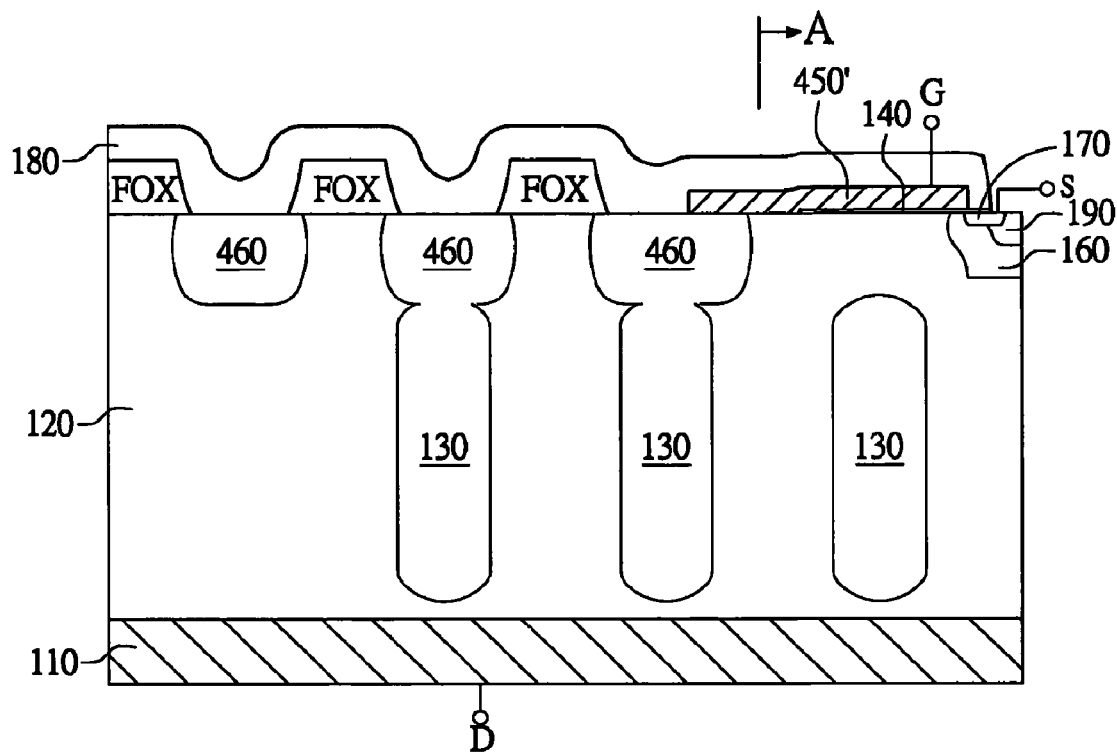
FIG. 9B is a schematic cross-section view showing a preferred embodiment of the second well of FIG. 8 being electrically connected to the gate electrode in accordance with the present invention.

Also referring to FIGS. 9A and 9B, in order to electrically connect the second well to the gate electrode G or the source electrode S of the high-voltage metal oxide semiconductor device, the guard ring 460 located near the edge of the high-voltage metal oxide semiconductor device may be used as an interconnection structure. As shown, the P-type guard ring 460 is formed in the N-type epitaxial layer 120 and surrounding the P-type first well 160 in the active region A. The depth of the guard ring 460 is greater than the depth of the P-type first well 160. The P-type second well 130 is extended from the active region A to the edge of the high-voltage metal oxide semiconductor device and connected to the guard ring 460.

Referring to FIG. 9A, an opening 186 is formed in the dielectric layer 180 to expose the guard ring 460 and a source metal layer 195 deposited on the dielectric layer is connected to the source region 170 and the guard ring 460. Thereby, the P-type second well 130 is electrically connected to the source electrode S through the guard ring 460 and the source metal layer 195. Referring to FIG. 9B, the gate conductive layer 450' near the edge of the active region A is extended toward the upper surface of the guard ring 460 and connected to the guard ring 460. Thereby, the P-type second well 130 is electrically connected to the gate electrode G through the guard ring 460 and the gate conductive layer 450'.

Figure 10A:
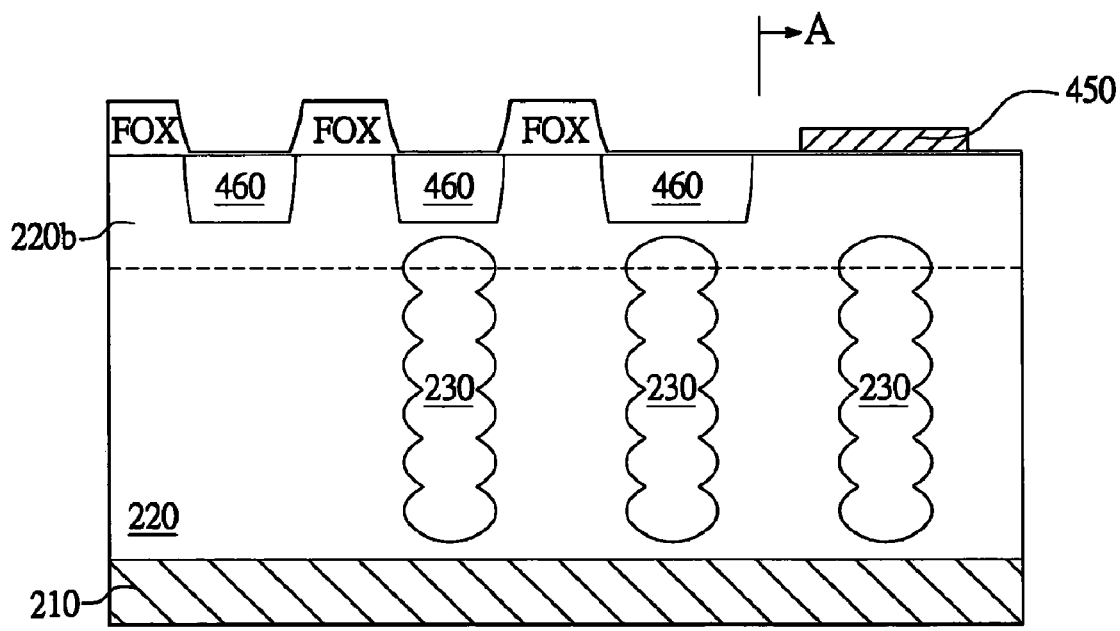
FIGS. 10A to 10C are schematic views showing a preferred embodiment of the fabrication method of the high-voltage metal oxide semiconductor device of FIG. 8 and the guard ring thereof in accordance with the present invention.
Figure 10B:
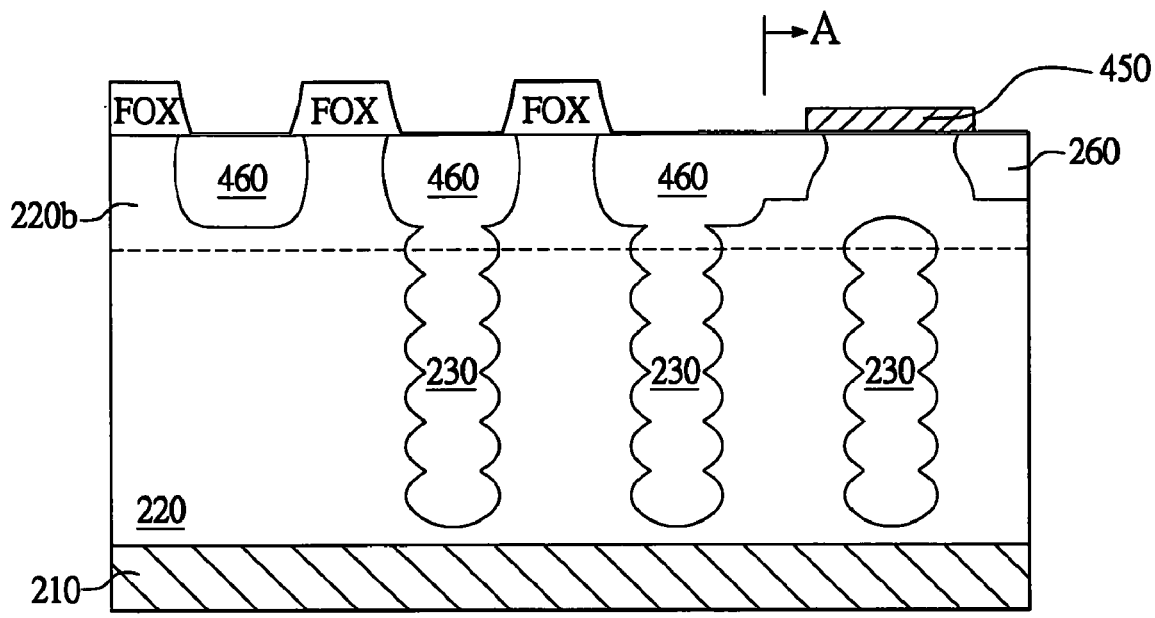
Figure 10C:
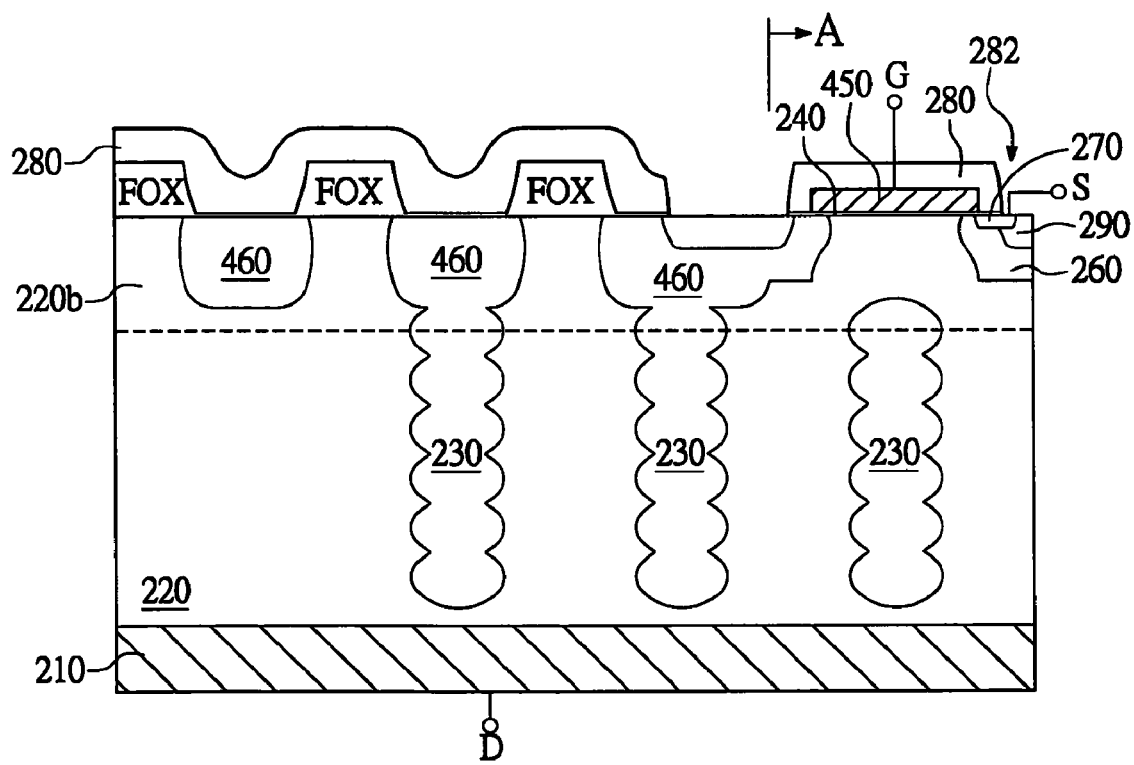

FIGS. 10A to 10C are schematic views showing a preferred embodiment of the fabrication method of the metal oxide semiconductor device as shown in FIG. 8 with the guard ring 460. Following the step of FIG. 4C, referring to FIG. 10A, the second epitaxial layer 220b is then formed on the stacked first epitaxial layers 220a and a P-type guard ring 460 is formed in the second epitaxial layer 220b to define an active region A. Turns to the top view, the guard ring 460 would be planarly overlapped with the P-type vertical well 230 (corresponding to the second well 130 of FIG. 8) in the epitaxial layer 220. Then, a gate conductive layer 450 is formed on the upper surface of the second epitaxial layer 220b and vertically aligned to the vertical well 230.

Afterward, referring to FIG. 10B, P-type dopants are implanted in the second epitaxial layer 220b by using the gate conductive layer 450 as a mask. The implanted P-type dopants are then driven into the second epitaxial layer 220b by heat to form a plurality of P-type first wells 260 away from the vertical well 230 with a predetermined distance. It is noted that the above mentioned step of driving-in the P-type dopants also drives the P-type dopants of the guard ring 460 into the second epitaxial layer 220b so as to expand the range of the guard ring 460 downward to connect with the P-type vertical well 230.

Afterward, referring to FIG. 10C, the location of a plurality of source regions 270 is defined by using a source mask (not shown), and then N-type dopants are implanted in the first wells 260 to form the source regions 270. Thereafter, a dielectric layer 280 is deposited over the exposed surface. Then, a plurality of contact windows 282 are formed in the dielectric layer 280 to expose the source regions 270 and the first wells 260 under the dielectric layer 280. Afterward, P-type dopants are implanted in the first wells 260 through the dielectric layer 280 to form a plurality of P-type heavily doped regions 290 in the first wells 260.

The high-voltage metal oxide semiconductor device provided in the present invention has the following advantages:

Firstly, referring to FIGS. 2A and 2B, as the voltage difference ($V_{GS}$) between the gate electrode G and the source electrode S of the metal oxide semiconductor device is smaller than a threshold voltage ($V_{TH}$), the forward bias applied between the drain electrode D and the source electrode S may result in the expansion of depletion regions to block the N-type area between the first well 160 and the second well 130. The depletion region shows perfect voltage blocking capability. Therefore, the withstanding voltage of the metal oxide semiconductor device can be dramatically increased. On the other hand, as the voltage difference ($V_{GS}$) between the gate electrode G and the source electrode S of the metal oxide semiconductor device is greater than a threshold voltage ($V_{TH}$), a channel is formed in the P-type first well 160 between the N-type source region 170 and the N-type epitaxial layer 120. Free electrons of the source region 170 are injected to the depletion region through the channel to recover the conductivity of the N-type area to rebuild the conduction path from the source region 170 to the substrate 110. It is noted that the on-resistance of the metal oxide semiconductor device is related to the dope concentration of the N-type epitaxial layer 120 but the withstanding voltage is not. Therefore, it is possible to achieve the object of low on-resistance by increasing dope concentration but remain high voltage blocking capability at the same time.

Secondly, referring to FIG. 2A, the depletion region for blocking the conduction path is formed between the first well 160 and the second well 130. The distance between the first well 160 and the second well 130 is smaller than the distance between two neighboring first wells 160. Therefore, in contrast with the traditional high-voltage metal oxide semiconductor devices with lateral PN junctions, such as Coolmos™ and super junction device, which need to recover the conductivity of the depletion region with a width substantially identical to the distance between neighboring first wells 160 to rebuild the conduction path, the time needed to rebuild the conduction path in accordance with the high-voltage metal oxide semiconductor device in accordance with the present invention is much faster.

In addition, referring to FIG. 2A, there are two intrinsic zener diodes, one is located between the heavily doped region 190, the first well 160, and the N-type epitaxial layer 120, and the other is located between the second well 130 and the N-type epitaxial layer 120. When avalanche breakdown happens, avalanche current would be shared by the two zener diodes rather than concentrated to the zener diode between the heavily doped region 190, the first well 160, and the N-type epitaxial layer 120. Therefore, the current flowing through the resistor traversing the epitaxial layer below the second portion 154 is reduced so as to prevent the bipolar junction transistor between the N-type epitaxial layer 120, P-type first well 160, and the source region 170 from being damaged by large current.

While the preferred embodiments of the present invention have been set forth for the purpose of disclosure, modifications of the disclosed embodiments of the present invention as well as other embodiments thereof may occur to those skilled in the art. Accordingly, the appended claims are intended to cover all embodiments which do not depart from the spirit and scope of the present invention.

What is claimed is:

1. A high-voltage metal oxide semiconductor device comprising:
    a main body of a first conductivity type; a conductive structure, having a first portion and a second portion, the first portion extending from an upper surface of the main body into the main body, and the second portion extending along the upper surface of the main body;
    a first well of a second conductivity type, located in the main body below the second portion, and kept away from the first portion with a predetermined distance through a portion of the main body of the first conductivity type located between the first well and the first portion;
    a source region of the first conductivity type, located in the first well; and
    a second well of the second conductivity type, located in the main body and extending from a bottom of the first portion to a place close to a drain region;
    wherein the conductive structure is electrically connected to a gate electrode, the conductive structure and the second well are located under the gate electrode, and an extending distance of the first portion of the conductive structure is greater than a depth of the first well; and
    wherein when a voltage difference between the gate electrode and a source electrode is greater than a threshold voltage, a channel is formed in the first well under the second portion to connect the source region and the main body, and the channel is a lateral channel.

2. The high-voltage metal oxide semiconductor device as claimed in claim 1, wherein the first portion is connected to the second portion.

3. The high-voltage metal oxide semiconductor device as claimed in claim 1, wherein a dielectric layer is interposed between the first portion and the second portion, the first portion is electrically connected to the source region, and the second portion is electrically connected to a gate electrode.

4. The high-voltage metal oxide semiconductor device as claimed in claim 1, wherein the drain region is located on a bottom of the main body.

5. The high-voltage metal oxide semiconductor device as claimed in claim 1, wherein the second well and the first portion are separated by at least an oxide layer and a potential of the second well depends on a potential of the first portion of the conductive structure.

6. The high-voltage metal oxide semiconductor device as claimed in claim 1, wherein a width of the second well is greater than a width of the first portion.

* * * * *